United States Patent
Kondoh

(10) Patent No.: US 9,280,049 B2
(45) Date of Patent: Mar. 8, 2016

(54) PATTERN FORMATION METHOD AND SEMICONDUCTOR DEVICE

(71) Applicant: Kabushiki Kaisha Toshiba, Minato-ku (JP)

(72) Inventor: Takehiro Kondoh, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/457,260

(22) Filed: Aug. 12, 2014

(65) Prior Publication Data
US 2015/0227045 A1 Aug. 13, 2015

(30) Foreign Application Priority Data

Feb. 13, 2014 (JP) .................................. 2014-025137

(51) Int. Cl.
*H01L 21/027* (2006.01)
*G03F 7/16* (2006.01)
*G03F 7/20* (2006.01)

(52) U.S. Cl.
CPC *G03F 7/168* (2013.01); *G03F 7/20* (2013.01); *H01L 21/0273* (2013.01); *H01L 21/0274* (2013.01)

(58) Field of Classification Search
CPC ............ H01L 21/0337; H01L 21/0338; H01L 21/31144; H01L 21/0273; H01L 21/3086; H01L 21/3088; H01L 21/31138; H01L 21/76816
See application file for complete search history.

(56) References Cited

U.S. PATENT DOCUMENTS

| 5,858,620 | A | 1/1999 | Ishibashi et al. | |
|---|---|---|---|---|
| 6,579,657 | B1 | 6/2003 | Ishibashi et al. | |
| 7,288,478 | B2 * | 10/2007 | Bailey | H01L 21/0273 257/E21.026 |
| 7,527,918 | B2 | 5/2009 | Kondoh et al. | |
| 2005/0130068 | A1 | 6/2005 | Kondoh et al. | |
| 2005/0255696 | A1 * | 11/2005 | Makiyama | G03F 7/40 438/637 |
| 2009/0214823 | A1 * | 8/2009 | Cheng | B81C 1/00031 428/137 |
| 2015/0168841 | A1 * | 6/2015 | Matsunaga | G03F 7/2024 430/324 |

FOREIGN PATENT DOCUMENTS

| JP | 10-73927 | 3/1998 |
|---|---|---|
| JP | 2005-158900 | 6/2005 |
| JP | 2010-210751 | 9/2010 |
| JP | 2013-201356 | 10/2013 |
| JP | 2013-228492 | 11/2013 |
| JP | 2013-247159 | 12/2013 |

* cited by examiner

*Primary Examiner* — Jaehwan Oh
(74) *Attorney, Agent, or Firm* — Oblon, McClelland, Maier & Neustadt, L.L.P.

(57) ABSTRACT

A pattern formation method according to the present embodiment includes forming a resist film on a treatment target material. The resist film is processed into resist patterns. A cross-link film or a coating agent protecting the resist film is coated onto the resist film. A self-organizing material is applied onto the resist film having the cross-link film or the coating agent coated thereon. The self-organizing material is thermally treated to achieve phase separation. A part of the self-organizing material which has been phase-separated is removed.

15 Claims, 5 Drawing Sheets

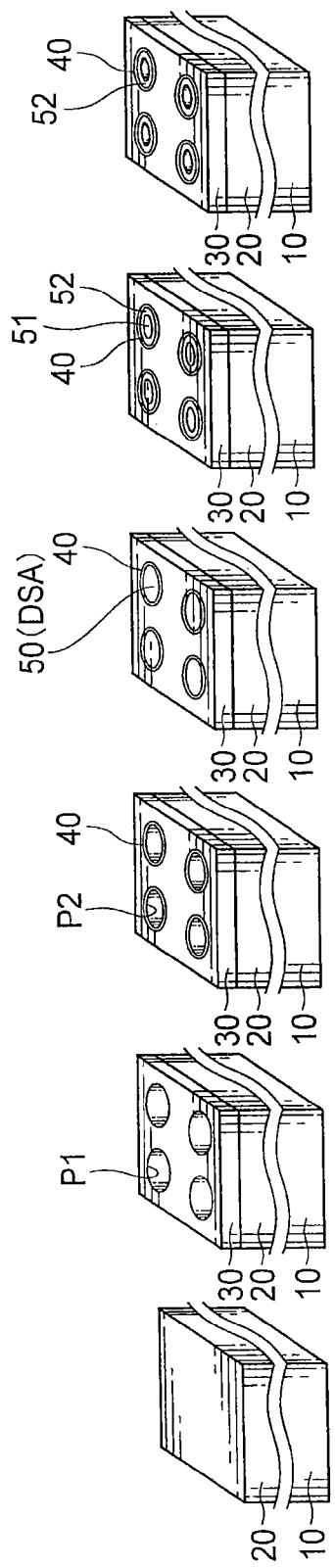

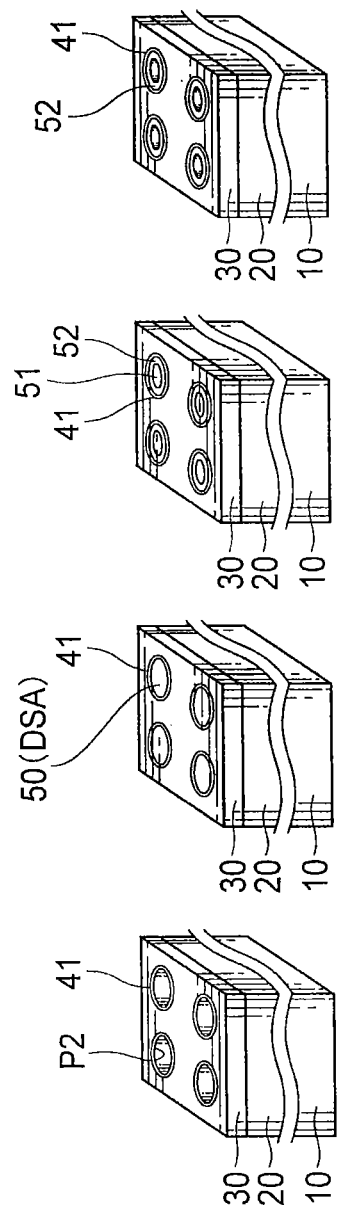

PATTERN FORMATION METHOD AND SEMICONDUCTOR DEVICE

CROSS REFERENCE TO RELATED APPLICATIONS

This application is based upon and claims the benefit of priority from the prior Japanese Patent Application No. 2014-025137, filed on Feb. 13, 2014, the entire contents of which are incorporated herein by reference.

FIELD

The embodiments of the present invention relate to a pattern formation method and a semiconductor device.

BACKGROUND

In a photolithographic technique for a manufacturing process of a semiconductor device, an optimum amount of shrink to keep a large DOF (Depth Of Focus) depends on the density of resist patterns obtained by patterning (the pitch of the patterns). For example, when the resist patterns are dense and the pitch thereof is quite small, the amount of shrink needs to be small or zero to keep the DOF. In contrast, when the resist patterns are rough and the pitch thereof is relatively large, it is preferable that the amount of shrink is larger to increase the DOF.

However, when dense patterns and rough patterns are both to be formed on the same semiconductor substrate, it is difficult to optimize the amount of shrink to keep the DOF.

To vary the amounts of shrink in the resist patterns, a polymer-blend DSA (Directed Self-Assembly) material is conceivably used. The polymer-blend DSA material is guided with resist patterns used as guide patterns, thereby forming finer patterns than the resist patterns. However, a solvent (butyl acetate, for example) of the polymer-blend DSA material has a property of dissolving a positive resist. Therefore, in a case where the resist patterns are formed of a positive resist, the solvent adversely dissolves the resist when the polymer-blend DSA material is used.

BRIEF DESCRIPTION OF THE DRAWINGS

FIGS. 1A to 1F are schematic perspective views showing an example of a pattern formation method according to a first embodiment;

FIGS. 5A to 5D are perspective views showing an example of a pattern formation method according to a second embodiment.

DETAILED DESCRIPTION

Figure 2B:
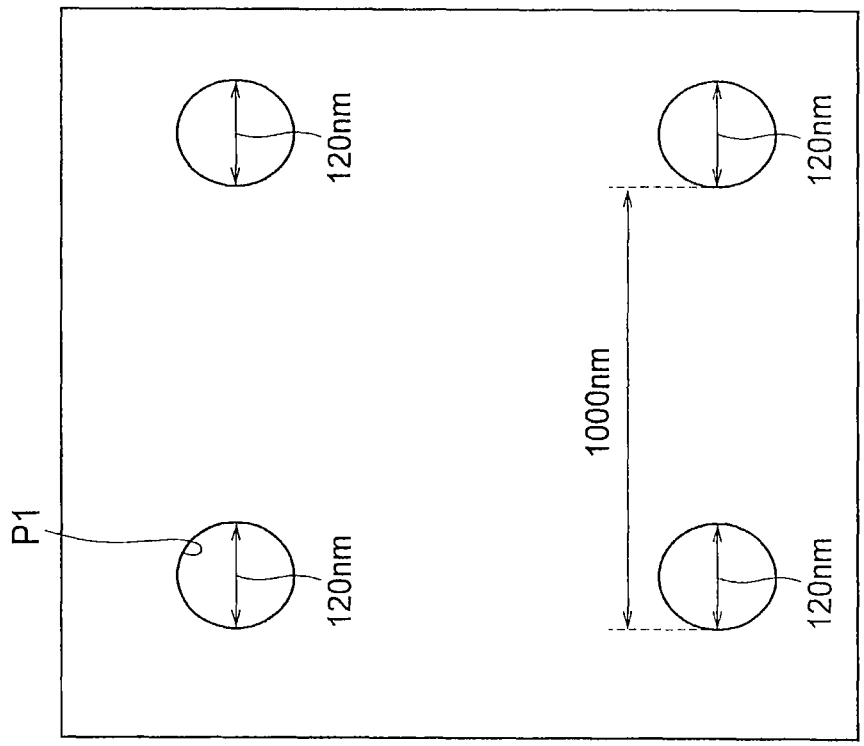
FIG. 2B is a plan view showing the patterns P1 of the contact holes in the peripheral circuit area.

Embodiments will now be explained with reference to the accompanying drawings. The present invention is not limited to the embodiments. In the embodiments, "an upper direction" or "a lower direction" refers to a relative direction when a direction of a surface of a substrate on which semiconductor elements are provided is assumed as "an upper direction". Therefore, the term "upper direction" or "lower direction" occasionally differs from an upper direction or a lower direction based on a gravitational acceleration direction.

A pattern formation method according to the present embodiment includes forming a resist film on a treatment target material. The resist film is processed into resist patterns. A cross-link film or a coating agent protecting the resist film is coated onto the resist film. A self-organizing material is applied onto the resist film having the cross-link film or the coating agent coated thereon. The self-organizing material is thermally treated to achieve phase separation. A part of the self-organizing material which has been phase-separated is removed.

First Embodiment

FIGS. 1A to 1F are schematic perspective views showing an example of a pattern formation method according to a first embodiment. The pattern formation method according to the present embodiment can be used to form patterns of via contacts of a NAND flash memory, for example. The via contacts of the NAND flash memory are formed in a memory cell array and a peripheral circuit area. The density of patterns of the via contacts is relatively high in the memory cell array and relatively low in the peripheral circuit area. Meanwhile, the diameters of contact holes of the via contacts are required to form to be equal in the memory cell array and in the peripheral circuit area. That is, it is required to form the via contacts having uniform diameters in the memory cell array and in the peripheral circuit area. A method of forming patterns of the via contacts in the memory cell array and in the peripheral circuit area is hereinafter explained. The pattern formation method according to the present embodiment is of course applicable also to other patterns or other semiconductor devices.

As shown in FIG. 1A, a treatment target material 20 is first formed above a substrate 10. The substrate 10 can be a semiconductor substrate such as a silicon substrate. The treatment target material 20 is a material to be patterned, such as a silicon dioxide film, a silicon nitride film, or a polysilicon film.

An ArF organic antireflective film (not shown) is then applied onto the treatment target material 20. The ArF organic antireflective film is baked at a temperature of about 215° C. for about one minute. This forms an ArF organic antireflective film having a thickness of about 80 nanometers.

A photoresist film 30 is then applied onto the ArF organic antireflective film as shown in FIG. 1B. The photoresist film 30 is, for example, a positive (polarity conversion) resist and is a material having a property of dissolving in butyl acetate. The resist film 30 is baked at about 130° C. for one minute. In this way, the resist film 30 having a thickness of about 200 nanometers is formed.

Figure 2A:
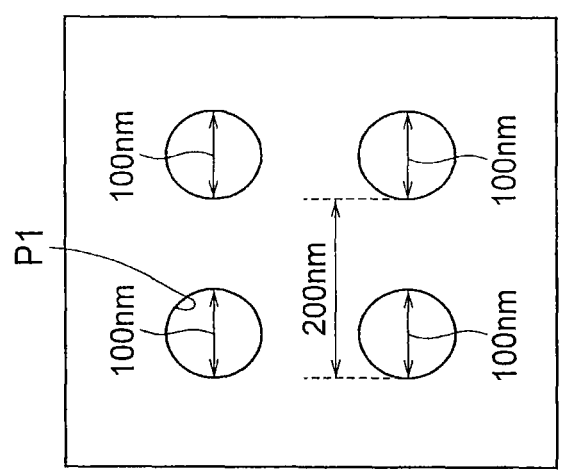
FIG. 2A is a plan view showing the patterns P1 of the contact holes in the memory cell array.

The resist film 30 is then exposed to light using an ArF excimer laser exposure device. The resist film 30 is baked at a temperature of about 100° C. for one minute. The resist film 30 is then developed with a TMAH (Tetramethylammonium hydroxide) solution. The resist film 30 is thereby processed into patterns P1 of the contact holes as shown in FIG. 1B. The patterns P1 of the contact holes are explained below with reference to FIGS. 2A and 2B. FIG. 2A is a plan view showing the patterns P1 of the contact holes in the memory cell array. FIG. 2B is a plan view showing the patterns P1 of the contact holes in the peripheral circuit area. As shown in FIG. 2A, the pitch of the patterns P1 of the contact holes in the memory cell array is relatively small and is, for example, about 200 nanometers. The diameters of the patterns P1 of the contact holes in the memory cell array are relative small and are formed, for example, at about 100 nanometers. On the other hand, as shown in FIG. 2B, the pitch of the patterns P1 of the contact holes in the peripheral circuit area is relatively large and is, for example, about 1000 nanometers. In the peripheral circuit area, the diameters of the patterns P1 of the contact holes are relatively large and are formed, for example, at about 120 nanometers. A reason why the diameters of the patterns P1 in the peripheral circuit area are larger than those in the memory cell array is to increase the amount of shrink in the peripheral circuit area having a larger pitch to increase the DOF. The DOF indicates an acceptable amount of misalignment from the best focus at the time of exposure. Therefore, as the DOF is larger, patterns closer to a design value can be formed.

A cross-link film 40 for protecting the resist film 30 is then coated onto the resist film 30 as shown in FIG. 1C. This forms a layer of the cross-link film 40 on the surface of the patterns P1 of the resist film 30.

Figure 3B:
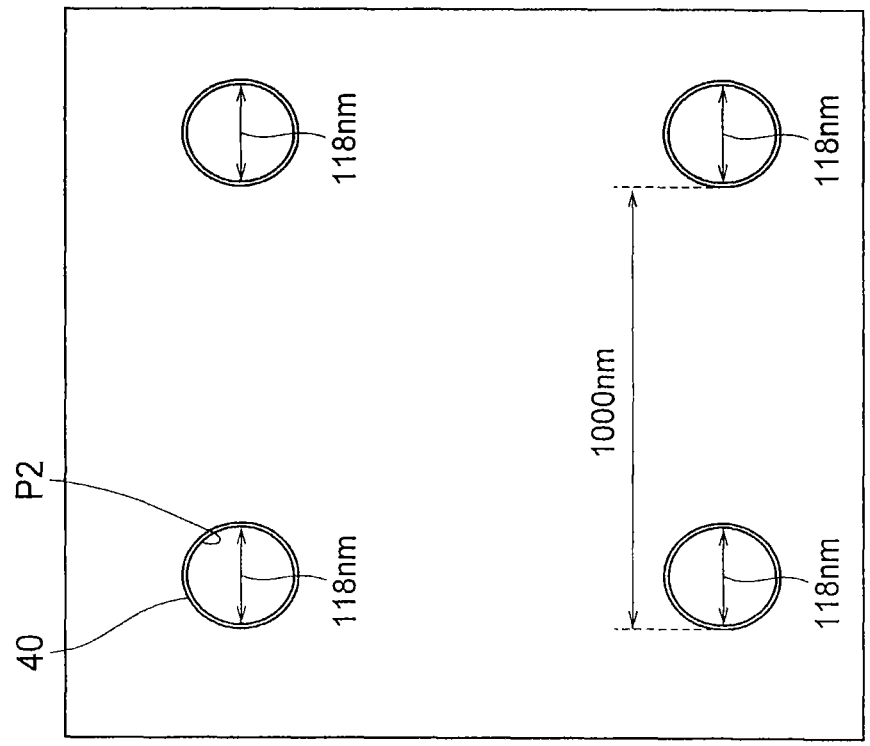
FIGS. 3A and 3B are plan views showing patterns P2 of the contact holes after the cross-link film 40 is coated.
Figure 3A:
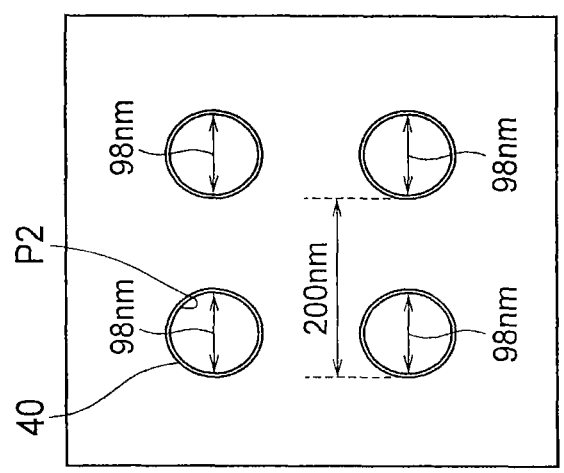

FIGS. 3A and 3B are plan views showing patterns P2 of the contact holes after the cross-link film 40 is coated. Because the cross-link film 40 is coated onto the inner surfaces of the contact holes, the contact holes become slightly smaller in the patterns P2 than those in the patterns P1. For example, as shown in FIG. 3A, the diameters of the patterns P2 of the contact holes in the memory cell array are formed, for example, at about 98 nanometers. As shown in FIG. 3B, the diameters of the patterns P2 of the contact holes in the peripheral circuit area are formed, for example, at about 118 nanometers. That is, the cross-link film 40 having a thickness of about 1 nanometer is formed on the resist film 30, whereby each of the patterns of the contact holes in the memory cell array and in the peripheral circuit area is shrunk by about 2 nanometers.

The cross-link film 40 is preferably a material that combines with the resist film 30 to protect the resist film 30.

The cross-link film 40 preferably has a property of not combining with a self-organizing material explained later (hereinafter, also "DSA material") to protect the resist film 30. This is because phase separation of the DSA material may be prevented if the cross-link film 40 combines with the DSA material. Furthermore, the cross-link film 40 preferably has a property of not dissolving in a solvent of the DSA material. This is because, if the cross-link film 40 dissolves in the solvent of the DSA material, the resist film 30 is exposed and thus the cross-link film 40 cannot function as a protective film for the resist film 30.

The cross-link film 40 is a resin containing a cross-linker and can be, for example, a material to be used for RELACS™ (Resolution Enhancement Lithography Assisted by Chemical Shrink) processing (hereinafter, also "RELACS material"). More specifically, the RELACS material is applied onto the patterns P1 of the contact holes in the resist film 30. At that time, the RELACS material has a thickness of about 300 nanometers, for example. The RELACS material is then baked at a temperature of about 100° C. for about 90 seconds. The RELACS material is then rinsed with pure water. Accordingly, a part: of the RELACS material not functioning as the cross-link film 40 (a part uncombined with the resist film 30) is removed. The RELACS material is then dried by spin drying. As a result, the cross-link film 40 is coated onto the surface of the resist film 30 and each of the patterns of the contact holes in the memory cell array and in the peripheral circuit area is shrunk by about 2 nanometers as described above.

Next, as shown in FIG. 1D, a DSA material 50 is applied onto the resist film 30 having the cross-link film 40 applied thereon. In this way, the DSA material 50 is filled in the patterns P2 of the contact holes formed in the resist film 30.

The DSA material 50 is, for example, a material including a hydrophilic polymer and a hydrophobic polymer mixed in a first organic solvent. More specifically, the DSA material 50 is a material including an acrylic resin as the hydrophilic polymer and a styrene resin as the hydrophobic polymer mixed in butyl acetate as the first organic solvent. That is, the DSA material 50 is a so-called polymer-blend DSA material. After the DSA material 50 mentioned above is applied onto the resist film 30, the DSA material 50 is baked at a temperature of about 130° C. for 60 seconds. The DSA material 50 is thereby phase-separated into a hydrophobic polymer layer (styrene resin) 51 and a hydrophilic polymer layer (acrylic resin) 52 as shown in FIG. 1E.

As shown in FIG. 1F, parts of the phase-separated DSA material 50 corresponding to the hydrophobic polymer layer 51 are then removed further using a second organic solvent. For example, butyl acetate is supplied as the second organic solvent on the resist film 30 and then spin drying is performed. That is, the second organic solvent can be the same butyl acetate as the first organic solvent. In this way, the parts corresponding to the hydrophobic polymer layer 51 is removed.

Figure 4B:
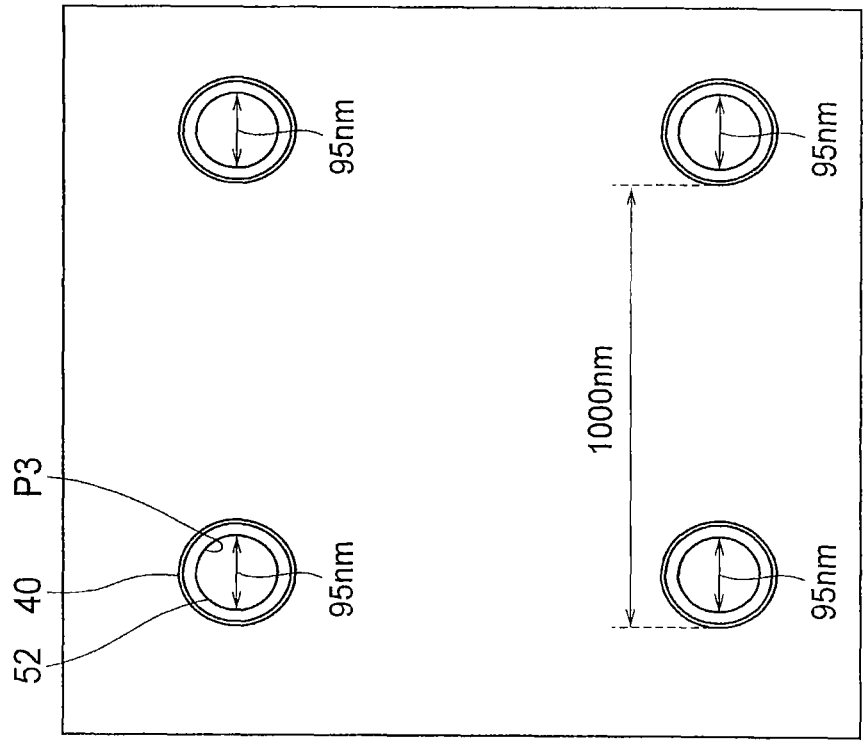
FIGS. 4A and 4B are plan views showing patterns P3 of the contact holes after performing the DSA processing.
Figure 4A:
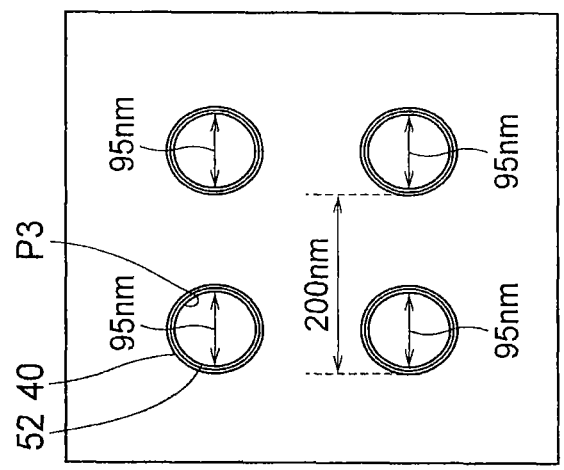

FIGS. 4A and 4B are plan views showing patterns P3 of the contact holes after performing the DSA processing. Because the hydrophilic polymer layer (acrylic resin) 52 is further formed on the inner surfaces of the contact holes, the contact holes become slightly smaller in the patterns P3 than those in the patterns P2. As shown in FIG. 4A, the diameters of the patterns P3 of the contact holes in the memory cell array are formed, for example, at about 95 nanometers. As shown in FIG. 4B, the diameters of the patterns P3 of the contact holes in the peripheral circuit area are formed, for example, at about 95 nanometers. It means that the hydrophilic polymer layer 52 having a thickness of about 1.5 nanometers is formed on the surface of the cross-link film 40 in the memory cell array. As a result, each of the diameters of the patterns of the contact holes in the memory cell array is shrunk by about 3 nanometers to about 95 nanometers. It also means that the hydrophilic polymer layer 52 having a thickness of about 11.5 nanometers is formed on the surface of the cross-link film 40 in the peripheral circuit area. As a result, each of the diameters of the patterns of the contact holes in the peripheral circuit area is shrunk by about 23 nanometers to about 95 nanometers. Accordingly, the patterns of the contact holes in the memory cell array and in the peripheral circuit area can have substantially equal diameters while the densities (that is, the pitches) thereof are different.

The treatment target material 20 is then processed using the resist film 30, the cross-link film 40, and the hydrophilic polymer layer 52 as a mask. A plurality of contact holes having equal diameters is thereby formed in the treatment target material 20. That is, contact holes having the same diameter can be formed both in the memory cell array having high-density patterns and in the peripheral circuit area having low-density patterns while differentiating the amounts of shrink from each other. A conductive material is then embedded into the contact holes, whereby contact plugs (not shown) are formed.

According to the present embodiment, the cross-link film is coated onto the positive resist film 30 before the polymer-blend DSA material 50 is applied onto the positive resist film 30. The resist film 30 thus does not directly contact the organic solvent (butyl acetate, for example) of the polymer-blend DSA material 50. Therefore, the cross-link film 40 can protect the resist film 30 from the organic solvent of the polymer-blend DSA material 50. That is, because the resist film 30 is not exposed to the organic solvent of the polymer-blend DSA material 50, the resist film 30 does not dissolve in the organic solvent of the polymer-blend DSA material 50 and thus mask patterns can be formed of the polymer-blend DSA material 50 even when the resist film 30 is a positive resist.

Because the mask patterns can be formed of the polymer-blend DSA material 50, the amount of shrink can be set smaller in the memory cell array having high-density patterns and the amount of shrink can be set larger in the peripheral circuit area having low-density patterns. That is, the pattern formation method according to the present embodiment can differentiate the amounts of shrink in patterns having different densities (different pitches). Accordingly, it is possible to control the amounts of shrink in dense patterns and rough patterns on the same substrate while keeping the DOFs thereof.

Second Embodiment

FIGS. 5A to 5D are perspective views showing an example of a pattern formation method according to a second embodiment. The second embodiment is different from the first embodiment in that a resist coating film 41 is used instead of the cross-link film 40. Other materials and processes in the second embodiment can be identical to those explained with reference to FIGS. 1A to 4B.

After the processes explained with reference to FIGS. 1A and 1B have been performed, the resist coating film 41 is formed on the resist film 30 as shown in FIG. 5A. The resist coating film 41 is preferably a material that combines with the resist film 30 to protect the resist film 30 as the cross-link film 40. Furthermore, the resist coating film 41 preferably has a property of not combining with the DSA material 50 to protect the resist film 30. If the resist coating film 41 combines with the DSA material 50, phase separation of the DSA material 50 may be adversely prevented. The resist coating film 41 preferably also has a property of not dissolving in the solvent of the DSA material 50. If the resist coating film 41 dissolves in the solvent of the DSA material 50, the resist film 30 is exposed and thus the resist coating film 41 cannot function as a protective film for the resist film 30. More specifically, the resist coating film 41 can be, for example, a resin containing a resin having a structure unit derived from at least either hydroxyacrylanilide or hydroxymethacrylanilide and a radical generator.

After the resist coating film 41 is applied, patterns of the contact holes in the memory cell array and in the peripheral circuit area are shrunk substantially equally. Therefore, the resist coating film 41 can function as the cross-link film 40.

The DSA processing is then performed as shown in FIG. 5B. The DSA processing is as explained with reference to FIG. 1D. A phase separation process in FIG. 5C and a process of removing the hydrophobic polymer layer 51 in FIG. 5D are as explained with reference to FIGS. 1E and 1F, respectively.

In the second embodiment, before the polymer-blend DSA material 50 is applied onto the positive resist film 30, the resist coating film 41 is coated onto the positive resist film 30. The resist film 30 thereby does not directly contact the organic solvent (butyl acetate, for example) of the polymer-blend DSA material 50. Therefore, the resist coating film 41 can protect the resist film 30 from the organic solvent of the polymer-blend DSA material 50 and thus the second embodiment can achieve an identical effect to that in the first embodiment.

The pattern formation methods according to the above embodiments can be used for manufacturing of a semiconductor device, a micromachine, and the like. Mask patterns finer than the minimum processing dimension of the photolithographic technique can be thereby formed. Therefore, the semiconductor device or the micromachine manufactured by the pattern formation methods according to the above embodiments can have finer mask patterns than the minimum processing dimension of the photolithographic technique.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A pattern formation method comprising:
   forming a resist film on a treatment target material, the resist film being a positive resist film;
   processing the resist film into resist patterns;
   coating a cross-link film or a coating agent, which protects the resist film from a self-organizing material, onto the resist film;
   applying the self-organizing material onto the resist film having the cross-link film or the coating agent coated thereon;
   thermally treating the self-organizing material to achieve phase separation; and
   removing a part of the self-organizing material which has been phase-separated.

2. The method of claim 1, wherein the cross-link film or the coating agent combines with the resist film and does not combine with the self-organizing material, the cross-link film or the coating agent has a property of not dissolving in a solvent of the self-organizing material.

3. The method of claim 1, wherein the self-organizing material is a material including a hydrophilic polymer and a hydrophobic polymer mixed in a first organic solvent.

4. The method of claim 2, wherein the self-organizing material is a material including a hydrophilic polymer and a hydrophobic polymer mixed in a first organic solvent.

5. The method of claim 1, wherein the self-organizing material is a material including an acrylic resin and a styrene resin mixed in butyl acetate.

6. The method of claim 2, wherein the self-organizing material is a material including an acrylic resin and a styrene resin mixed in butyl acetate.

7. The method of claim 3, wherein the self-organizing material is a material including an acrylic resin and a styrene resin mixed in butyl acetate.

8. The method of claim 1, wherein the self-organizing material is a polymer-blend DSA (Directed Self-Assembly) material.

9. The method of claim 3, wherein a part of the self-organizing material is removed through supply of a second organic solvent to the self-organizing material when a part of the self-organizing material is removed.

10. The method of claim 9, wherein the second organic solvent is a same material as the first organic solvent.

11. The method of claim 9, wherein the second organic solvent is butyl acetate.

12. The method of claim 10, wherein the second organic solvent is butyl acetate.

13. The method of claim 1, wherein the coating film contains a resin having a structure unit and a radical generator, the structure unit being derived from at least either hydroxyacrylanilide or hydroxymethacrylanilide.

14. A semiconductor device formed by the method of claim 1.

15. The method of claim 1, wherein the resist patterns include a first area having first hole patterns and a second area having second hole patters, wherein
    a density of the first hole patterns in the first area is higher than a density of the second hole patterns in the second area,
    diameters of the first hole patterns are larger than diameters of the second hole patterns, and,
    after removing the part of the self-organizing material, the first and second hole patterns are shrunk to a same diameter by the cross-link film or the coating agent and a non-removed part of the self-organizing material.

* * * * *